(12) United States Patent
Lee

(10) Patent No.: US 12,351,107 B2
(45) Date of Patent: Jul. 8, 2025

(54) VIRTUAL ENGINE SOUND GENERATION SYSTEM AND VIRTUAL ENGINE SOUND GENERATION METHOD

(71) Applicant: HYUNDAI MOBIS CO., LTD., Seoul (KR)

(72) Inventor: Jae Young Lee, Icheon-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 227 days.

(21) Appl. No.: 18/146,415

(22) Filed: Dec. 26, 2022

(65) Prior Publication Data
US 2023/0311756 A1 Oct. 5, 2023

(30) Foreign Application Priority Data
Mar. 29, 2022 (KR) ......................... 10-2022-0038745

(51) Int. Cl.
*B60Q 5/00* (2006.01)
*G10K 15/02* (2006.01)
*H03G 5/16* (2006.01)

(52) U.S. Cl.
CPC ............. *B60Q 5/008* (2013.01); *G10K 15/02* (2013.01); *H03G 5/165* (2013.01)

(58) Field of Classification Search
None
See application file for complete search history.

(56) References Cited

U.S. PATENT DOCUMENTS 10,266,112 B1 * 4/2019 Lee ........................ B60Q 5/008
2019/0111839 A1 * 4/2019 Lee ........................ G06N 20/00

FOREIGN PATENT DOCUMENTS

KR      20190044292 A      4/2019
WO      WO-2017067570 A1 *  4/2017 ............. G10K 15/02

* cited by examiner

*Primary Examiner* — Kenny H Truong
(74) *Attorney, Agent, or Firm* — NovoTechIP International PLLC

(57) ABSTRACT

Provided are a virtual engine sound generation system and a virtual engine sound generation method using the same, and more particularly, a virtual engine sound generation system and a virtual engine sound generation method using the same capable of providing a virtual engine sound to which a sensation of gear shifting is added by calculating a virtual gear stage and a virtual RPM signal through a current vehicle speed and current APS information and generating a virtual engine sound based on the virtual gear stage and the virtual RPM signal.

13 Claims, 8 Drawing Sheets

VIRTUAL ENGINE SOUND GENERATION SYSTEM AND VIRTUAL ENGINE SOUND GENERATION METHOD

CROSS-REFERENCE TO RELATED APPLICATIONS

This application claims priority under 35 U.S.C. § 119 to Korean Patent Application No. 10-2022-0038745, filed on Mar. 29, 2022, in the Korean Intellectual Property Office, the disclosure of which is incorporated herein by reference in its entirety.

TECHNICAL FIELD

The following disclosure relates to a virtual engine sound generation system and a virtual engine sound generation method using the same, and more particularly, to a virtual engine sound generation system and a virtual engine sound generation method using the same capable of providing a virtual engine sound to which a sensation of gear shifting is added by calculating a virtual gear stage and a virtual RPM signal through a current vehicle speed and current APS information and generating a virtual engine sound based on the virtual gear stage and the virtual RPM signal.

BACKGROUND

Active sound design (ASD) is for synthesizing vehicle sounds using sound reinforcement techniques in order to change or improve the sounds inside and outside the vehicle.

Recently, as the demand for eco-friendly engines has increased, the efficiency of engine systems has increased, but auditory satisfaction given to consumers has decreased.

In addition, electric vehicles and fuel cell vehicles produce high-pitched sounds that general combustion engines do not have. For this reason, in order to satisfy consumers as to an emotional quality of engine sound, the ASD is used to generate or enhance an engine sound to be output through a sound output unit as illustrated in FIG. 1.

The left side of FIG. 1 illustrates that, in a state where ASD is turned off, an engine sound of a 4-cylinder engine flows to the inside of a vehicle, and the right side of FIG. 1 illustrates that, in a state where ASD is turned on, an engine sound of a 6-cylinder engine is generated by the ASD and output through a sound output unit.

In a current electric vehicle, noise and vibration transmitted to the interior of the vehicle are significantly small by virtue of an electric motor rotating quietly and smoothly. So, a driving sound of the electric vehicle is very small, which may cause a driver to feel bored during movement in the vehicle.

Therefore, an ASD technique for an electric vehicle has been developed to maximize driving immersion by adding an auditory element to the electric vehicle. In this technique, an output torque of the electric vehicle is received, the output torque is converted into an engine sound at a specific RPM, and then the engine sound is output to the interior of the vehicle through a sound output unit.

However, an electric vehicle is operated by a motor and a decelerator, provides a higher RPM than a vehicle operated by an engine, and has only a small change in output torque during gear shifting. As a result, when an electric vehicle implements a driving sound by receiving a motor torque signal, it is difficult for the electric vehicle to generate a sound caused when the RPM periodically changes during gear shifting as in an internal combustion engine vehicle.

That is, in order to satisfy consumers who want the driving sound of an internal combustion engine vehicle, a method capable of making an electric vehicle replicate the driving sound of the internal combustion engine vehicle is required.

SUMMARY

An embodiment of the present invention is directed to providing a virtual engine sound generation system and a virtual engine sound generation method using the same capable of adding a sensation of gear shifting to increase a driver's immersion and satisfaction during driving by calculating a virtual gear stage and a virtual RPM signal based on a current vehicle speed, current APS information, and a vehicle parameter and generating a virtual engine sound through the virtual gear stage and the virtual RPM signal, and capable of reducing a system construction cost by utilizing conventional active sound design (ASD).

In one general aspect, a virtual engine sound generation system includes: a control unit generating a virtual RPM signal based on received vehicle state information and a preset vehicle parameter; and a virtual engine sound generation unit generating a virtual engine sound based on the vehicle state information and the virtual RPM signal, so that the virtual engine sound is output through a sound output unit.

The vehicle state information may be at least one of APS information, which is an accelerator pedal pressing rate, and a vehicle speed, and the vehicle parameter may be at least one of a transmission gear ratio, a final speed reduction ratio, a gear shift pattern, a tire width, a tire flatness ratio, a wheel diameter, the number of stroke cylinders, the number of cylinders, and an amplification factor for each harmonic.

The control unit may calculate a virtual gear stage based on the vehicle state information and the gear shift pattern, and generate the virtual RPM signal based on a preset transmission gear ratio corresponding to the calculated virtual gear stage.

The control unit may calculate the virtual RPM signal through the following Equation 1:

$$\text{virtual } RPM \text{ signal} = \frac{\text{vehicle speed (km/h)} \times \text{transmission gear ratio} \times \text{final speed reduction ratio} \times 10^6}{(3.78 \times \text{tire width (mm)} \times \text{flatness ratio}) + (4800 \times \text{wheel diameter(inch)})}.$$

[Equation 1]

The control unit may calculate a first APS threshold value and a second APS threshold value based on the vehicle speed and the APS information, increase the virtual gear stage by at least 1 when the APS information is smaller than the first APS threshold value, and decrease the virtual gear stage by at least 1 when the APS information is greater than or equal to the first APS threshold value or when the APS information is greater than the second APS threshold value.

Based on the vehicle speed and the APS information, the control unit may calculate the first APS threshold value corresponding to the virtual gear stage and the vehicle speed by interpolating an up shift table for the gear shift pattern, and calculate the second APS threshold value corresponding to the virtual gear stage and the vehicle speed by interpolating a down shift table for the gear shift pattern.

The virtual engine sound generation unit may include: a synthesizer generating an engine sound source frequency, using a tone or wavetable scheme, based on the virtual RPM signal; a harmonic controller generating an engine sound frequency by adding a harmonic component to the engine sound source frequency based on the vehicle state information and a preset amplification factor for each harmonic; and an equalizer differentially increasing the engine sound frequency to generate a normalized engine sound frequency so that all engine sound frequencies have a uniform level, and transmitting the normalized engine sound frequency to the sound output unit.

The synthesizer may calculate the engine sound source frequency based on the virtual RPM signal and the vehicle parameter through the following Equation 2:

$$\text{engine sound source frequency} = \frac{\text{virtual } RPM \text{ signal} \times 2}{60 \times S} \times E, \quad \text{[Equation 2]}$$

where S is the number of stroke cylinders, and E is the number of cylinders.

In another general aspect, a virtual engine sound generation method includes: a) determining, by the control unit, whether or not a virtual engine sound generation function is activated based on user setting information; b) when it is determined that the virtual engine sound generation function is activated, generating, by the control unit, a virtual RPM signal based on received vehicle state information and a preset vehicle parameter; and c) generating, by the virtual engine sound generation unit, a virtual engine sound based on the vehicle state information and the virtual RPM signal, so that the virtual engine sound is output through the sound output unit.

The vehicle state information may be at least one of APS information, which is an accelerator pedal pressing rate, and a vehicle speed, and the vehicle parameter may be at least one of a transmission gear ratio, a final speed reduction ratio, a gear shift pattern, a tire width, a tire flatness ratio, a wheel diameter, the number of stroke cylinders, the number of cylinders, and an amplification factor for each harmonic.

The step b) may include: b-1) calculating, by the control unit, a virtual gear stage based on the received vehicle state information; and b-2) calculating, by the control unit, the virtual RPM signal based on a preset transmission gear ratio corresponding to the calculated virtual gear stage.

The step b-1) may include: b-11) receiving, by the control unit, the vehicle speed and the APS information; b-12) calculating, by the control unit, a first APS threshold value corresponding to the virtual gear stage and the vehicle speed by interpolating an up shift table for the gear shift pattern based on the vehicle speed and the APS information; b-13) determining, by the control unit, whether or not the APS information is smaller than the first APS threshold value; b-14) increasing, by the control unit, the virtual gear stage by at least 1 when the APS information is smaller than the first APS threshold value; b-15) calculating, by the control unit, a second APS threshold value corresponding to the virtual gear stage and the vehicle speed, by interpolating a down shift table for the gear shift pattern, when the APS information is greater than or equal to the first APS threshold value or when the step b-14) is performed; and b-16) decreasing, by the control unit, the virtual gear stage by at least 1 when the APS information is greater than the second APS threshold value, and returning to the step b-11).

The virtual engine sound generation unit may include: a synthesizer generating an engine sound source frequency, using a tone or wavetable scheme, based on the virtual RPM signal; a harmonic controller generating an engine sound frequency by adding a harmonic component to the engine sound source frequency based on the vehicle state information and a preset amplification factor for each harmonic; and an equalizer differentially increasing the engine sound frequency to generate a normalized engine sound frequency so that all engine sound frequencies have a uniform level, and transmitting the normalized engine sound frequency to the sound output unit.

The step c) may include: c-1) generating, by the synthesizer, an engine sound source frequency, using a tone or wavetable scheme, based on the virtual RPM signal; c-2) generating, by the harmonic controller, an engine sound frequency by adding a harmonic component to the engine sound source frequency based on the vehicle state information and a preset amplification factor for each harmonic; and c-3) differentially increasing, by the equalizer, the engine sound frequency to generate a normalized engine sound frequency so that all engine sound frequencies have a uniform level, and transmitting the normalized engine sound frequency to the sound output unit.

In the step c-1), the synthesizer may calculate the engine sound source frequency based on the virtual RPM signal and the vehicle parameter through the following Equation 2:

$$\text{engine sound source frequency} = \frac{\text{virtual } RPM \text{ signal} \times 2}{60 \times S} \times E, \quad \text{[Equation 2]}$$

where S is the number of stroke cylinders, and E is the number of cylinders.

According to the present invention, by adding to a virtual engine sound a virtual RPM signal in which a gear shifting process is replicated, the virtual engine sound output from the ASD does not monotonically increase, but shifts up and down.

Accordingly, it is possible to increase driving immersion and user satisfaction for an occupant of a driving vehicle, and it is also possible to reduce a system construction cost by utilizing conventional ASD.

DETAILED DESCRIPTION OF EMBODIMENTS

Hereinafter, preferred embodiments of the present invention will be exemplified and referred to so as to describe the present invention, operational advantages of the present invention, and objects to be achieved by implementing the present invention.

Figure 1:
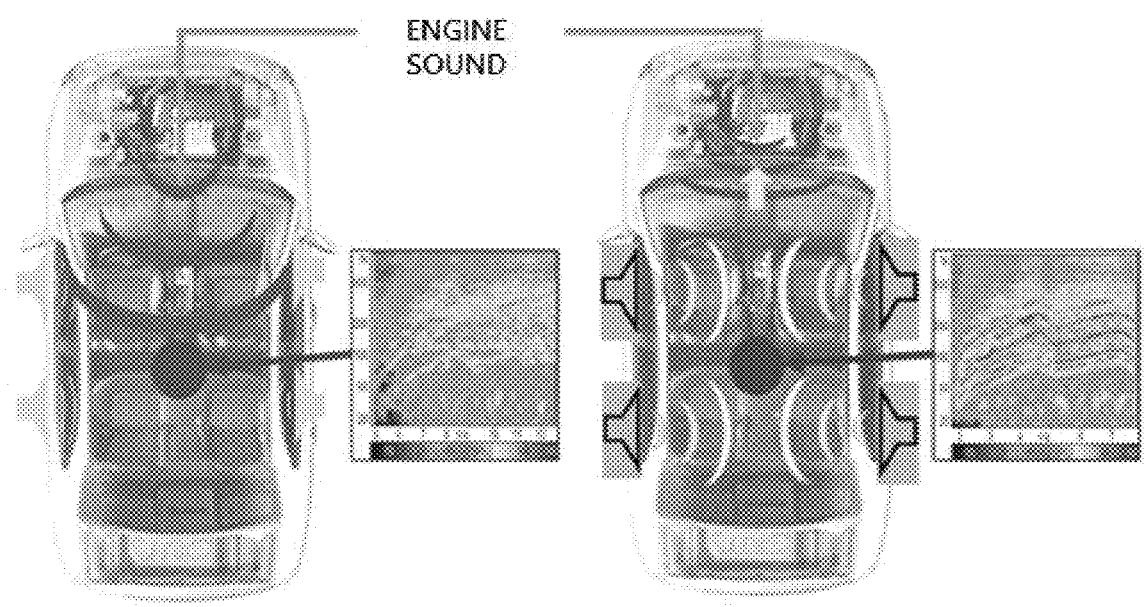
FIG. 1 is a diagram illustrating an operation principle of conventional active sound design (ADS).
Figure 2:
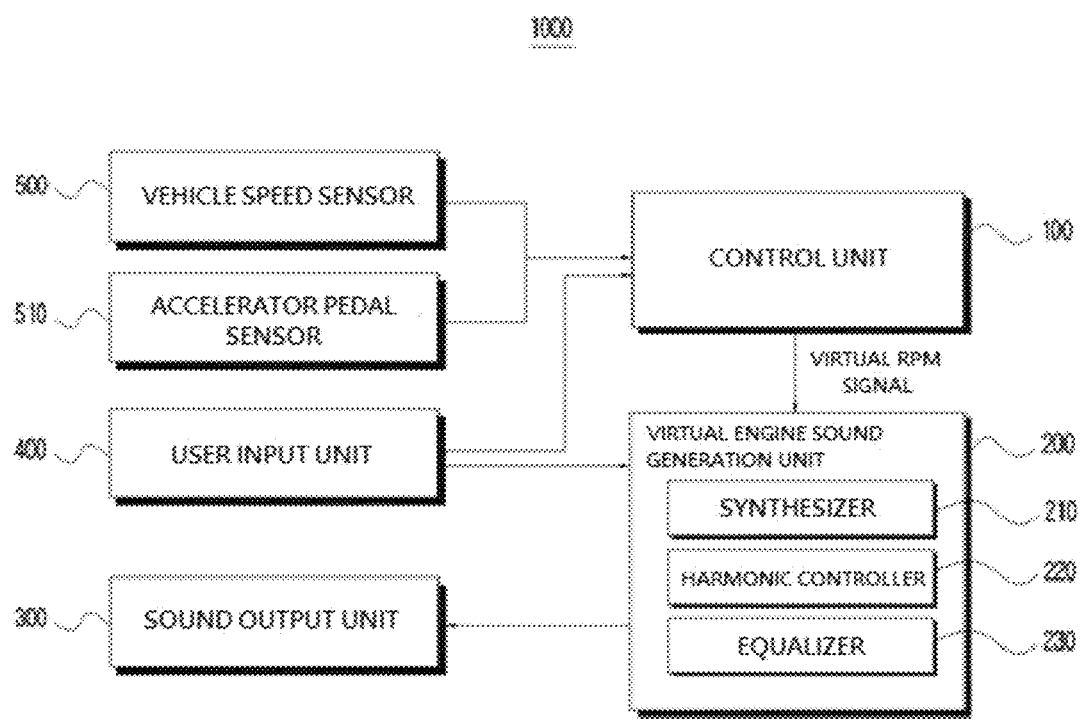
FIG. 2 is a diagram illustrating an internal configuration of a virtual engine sound generation system according to an embodiment of the present invention.

FIG. 2 is a diagram illustrating an internal configuration of a virtual engine sound generation system according to an embodiment of the present invention.

Referring to FIG. 2, a virtual engine sound generation system 1000 according to an embodiment of the present invention includes: a control unit 100 generating a virtual RPM signal based on received vehicle state information and preset vehicle parameters; and a virtual engine sound generation unit 200 generating a virtual engine sound based on the vehicle state information and the virtual RPM signal, so that the virtual engine sound is output through a sound output unit 300.

In the virtual engine sound generation system 1000 according to the present invention, in order to solve a problem of a conventional virtual engine sound generation device that is not capable of giving a sensation of gear shifting because a virtual engine sound is generated through information on a vehicle speed and an engine torque, the control unit 100 calculates a virtual gear stage and calculates a virtual RPM signal based on the virtual gear stage.

The virtual engine sound generation unit 200 generates a virtual engine sound through the virtual RPM signal generated as described above. As a result, it is possible to generate a virtual engine sound to which a sensation of gear shifting is added based on a vehicle speed and accelerator pedal sensor (APS) information, which is an accelerator pedal pressing rate, of the vehicle at a current time.

A process of generating such a virtual engine sound to which a sensation of gear shifting is added will be described in detail below. First, as described above, the control unit 100 is configured to generate a virtual RPM signal based on the received vehicle state information and the preset vehicle parameters.

Figure 3:
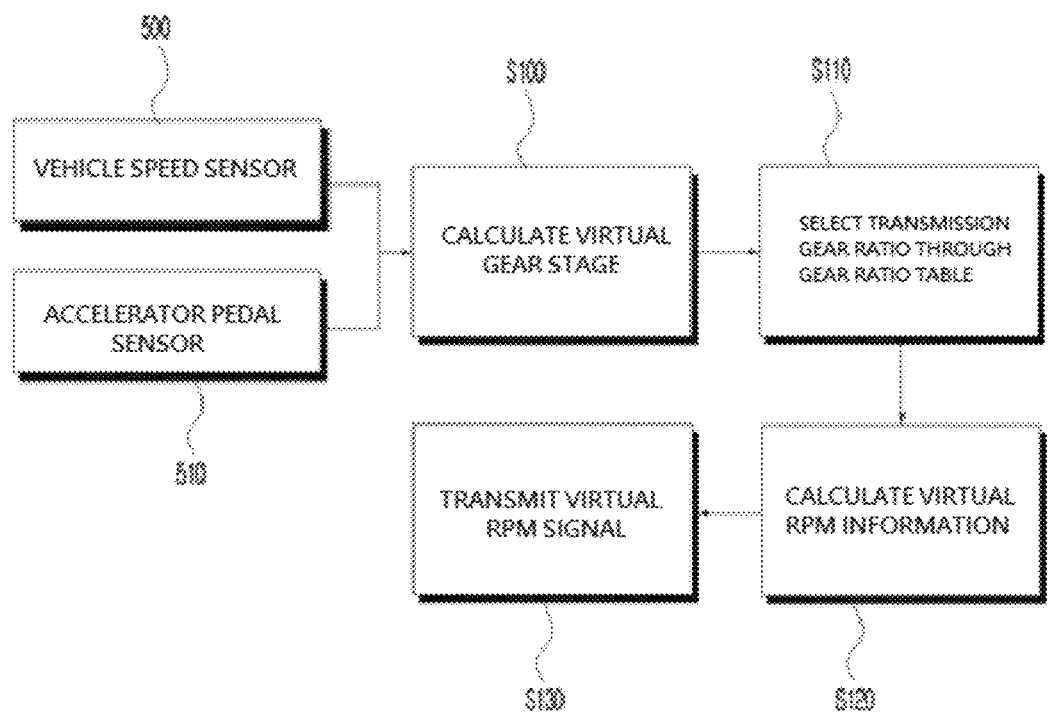
FIG. 3 is a diagram illustrating a process in which a control unit calculates a virtual RPM signal according to an embodiment of the present invention.

In a conventional internal combustion engine vehicle, RPM information may be obtained. However, in a vehicle driven by a motor, such as an electric vehicle, which is not capable of obtaining RPM information, in order to generate a virtual RPM signal, a virtual gear stage corresponding to a current state of the vehicle is calculated through a current vehicle speed as a speed of the vehicle, current APS information as an accelerator pedal pressing rate of the vehicle, and a preset gear shift pattern as illustrated in FIG. 3, according to the present invention.

When the virtual gear stage is calculated, a transmission gear ratio corresponding to the calculated virtual gear stage is selected from a preset gear ratio table, and a virtual RPM signal is calculated through the selected transmission gear ratio.

The virtual RPM signal is calculated through the following Equation 1.

$$\text{virtual } RPM \text{ signal} = \frac{\text{vehicle speed (km/h)} \times \text{transmission gear ratio} \times \text{final speed reduction ratio} \times 10^6}{(3.78 \times \text{tire width (mm)} \times \text{flatness ratio}) + (4800 \times \text{wheel diameter(inch)})}$$

[Equation 1]

Here, the tire width (mm), the tire flatness ratio, the wheel diameter (inch), the transmission gear ratio, and the final speed reduction ratio are preset vehicle parameters input from a user through a user input unit 400, which will be described below.

Additionally, the vehicle parameters include a gear shift pattern, the number of stroke cylinders, the number of cylinders, an amplification factor for each harmonic, etc. These parameters have initial default values, which may be changed through the user input unit 400.

In addition, the vehicle speed and the APS information are vehicle state information, and the control unit 100 and the virtual engine sound generation unit 200 receive the vehicle state information from sensing means such as a vehicle speed sensor 500 and an accelerator pedal sensor 510 provided in the vehicle.

The vehicle speed and APS information may be obtained through other sensing means in addition to the vehicle speed sensor 500 and the accelerator pedal sensor 510, and the present invention is not limited to these sensing means.

In addition, when a virtual RPM signal is calculated, the control unit 100 transfers the virtual RPM signal to the virtual engine sound generation unit 200.

Meanwhile, the virtual engine sound generation unit 200 includes: a synthesizer 210 generating an engine sound source frequency, using a tone or wavetable scheme, based on the virtual RPM signal; a harmonic controller 220 generating an engine sound frequency by adding a harmonic component to the engine sound source frequency based on the vehicle state information and a preset amplification factor for each harmonic; and an equalizer 230 differentially increasing the engine sound frequency to generate a normalized engine sound frequency so that all engine sound frequencies have a uniform level, and transmitting the normalized engine sound frequency to the sound output unit 300.

The virtual engine sound generation unit 200 is a component identical or similar to a conventional active sound design (ASD) system. However, while the conventional ADS system generates a virtual engine sound through a vehicle speed and a motor torque received as vehicle state information, the virtual engine sound generation unit 200 according to the present invention generates a virtual engine sound by receiving a virtual RPM signal, rather than a motor torque, together with a vehicle speed and APS information to add a sensation of gear shifting.

The biggest difference between the two methods is whether or not a sensation of gear shifting is included. In a conventional internal combustion engine vehicle, a sensation of gear shifting has a pattern in which an engine RPM increases according to a vehicle speed, decreases after gear shifting, and then increases again.

The sensation of gear shifting may cause the driver to have fun during driving, increasing a driver's immersion and satisfaction during driving. Also, the sensation of gear shifting may cause the driver to perceive a current speed, which is effective in driving safety.

Meanwhile, the synthesizer 210 generates a signal using a tone or wavetable scheme, based on the virtual RPM signal, the vehicle speed, and the APS information received from the control unit 100 described above.

The frequency in the generated signal may be changed according to the virtual RPM signal. Therefore, the engine sound source frequency generated by the synthesizer 210 may be calculated through the following Equation 2.

$$\text{engine sound source frequency} = \frac{\text{virtual } RPM \text{ signal} \times 2}{60 \times S} \times E \quad \text{[Equation 2]}$$

Here, S is the number of stroke cylinders and E is the number of cylinders, which are vehicle parameters as described above, and have preset values.

In addition, the harmonic controller 220 synthesizes a harmonic component with the engine sound source frequency transmitted from the synthesizer 210 based on the amplification factor for each harmonic, which is a preset vehicle parameter. The synthesized engine sound frequency is normalized by the equalizer 230, and the normalized engine sound frequency is transmitted to the sound output unit 300.

Meanwhile, in the present invention, the user input unit 400 may be included to receive vehicle parameters from the user and to receive user setting information regarding whether to operate the control unit.

Therefore, the control unit 100 first checks the user setting information regarding whether to operate the control unit 100 when generating a virtual RPM signal. When the control unit 100 is set to be operated, the control unit 100 generates a virtual RPM signal and transmits the virtual RPM signal to the virtual engine sound generation unit 200 as described above.

Hereinafter, a process in which the control unit 100 calculates a virtual RPM signal and a process in which the control unit 100 calculates a virtual gear stage will be described with reference to the drawings.

FIG. 3 is a diagram illustrating a process in which the control unit generates a virtual RPM signal according to an embodiment of the present invention.

Referring to FIG. 3, as described above, the control unit 100 generates a virtual RPM signal based on the received vehicle state information and vehicle parameters. To this end, the control unit 100 first calculates a current virtual gear stage of the vehicle based on a vehicle speed and APS information of the vehicle currently received from the vehicle speed sensor 500 and the accelerator pedal sensor 510, and a preset gear shift pattern (S100), and selects a transmission gear ratio corresponding to the virtual gear stage based on a preset gear ratio table (S110).

When the transmission gear ratio is specified, a virtual RPM signal is calculated according to the following Equation 1 (S120).

$$\text{virtual } RPM \text{ signal} = \frac{\text{vehicle speed (km/h)} \times \text{transmission gear ratio} \times \text{final speed reduction ratio} \times 10^6}{(3.78 \times \text{tire width (mm)} \times \text{flatness ratio}) + (4800 \times \text{wheel diameter(inch)})} \quad \text{[Equation 1]}$$

As described above, the tire width (mm), the tire flatness ratio, the wheel diameter (inch), and the final speed reduction ratio are preset vehicle parameters.

Accordingly, the control unit 100 transmits the generated virtual RPM signal to the virtual engine sound generation unit 200 (S130).

Figure 4:
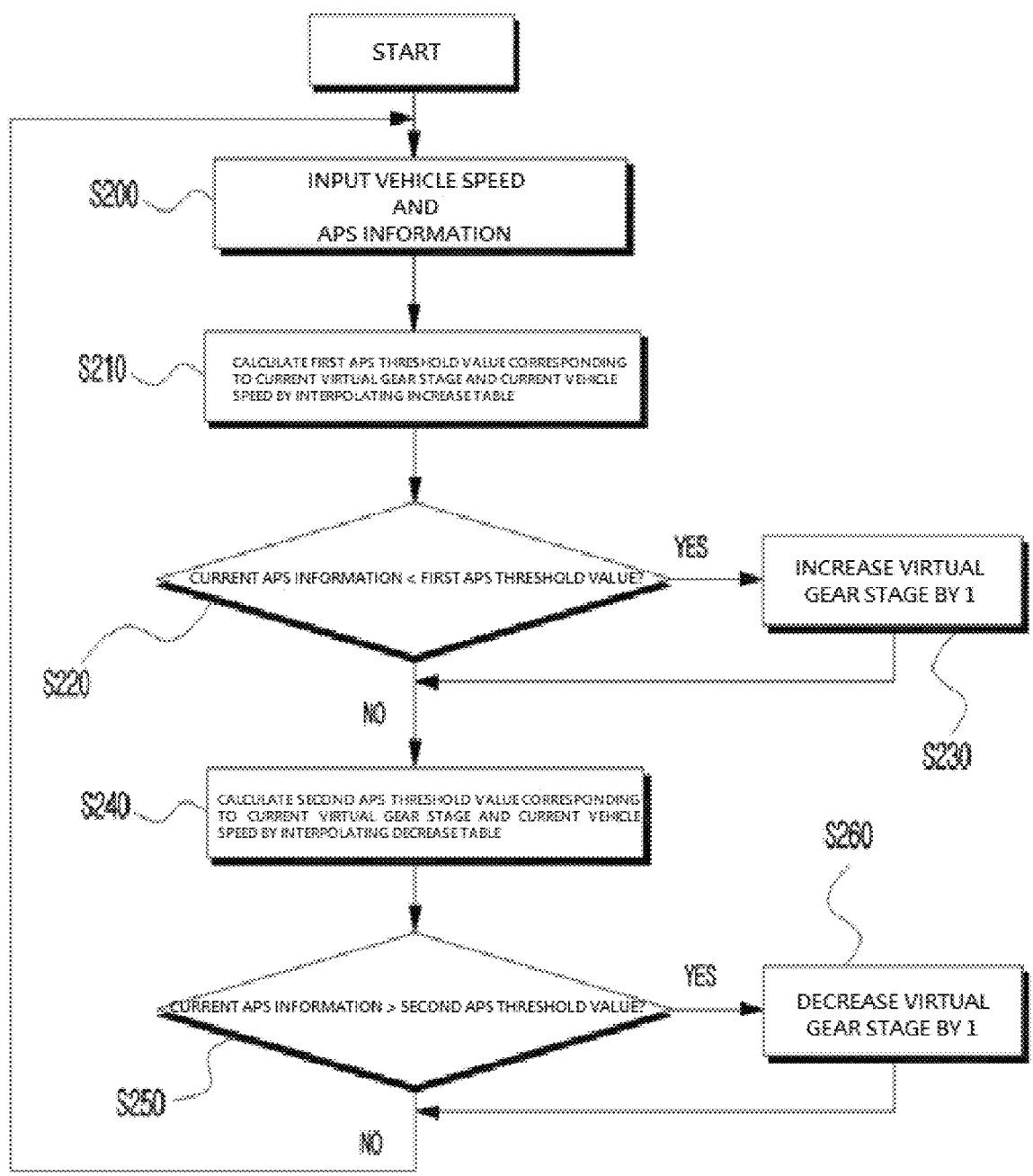
FIG. 4 is a diagram illustrating a process in which the control unit calculates a virtual gear stage according to an embodiment of the present invention.
Figure 5:
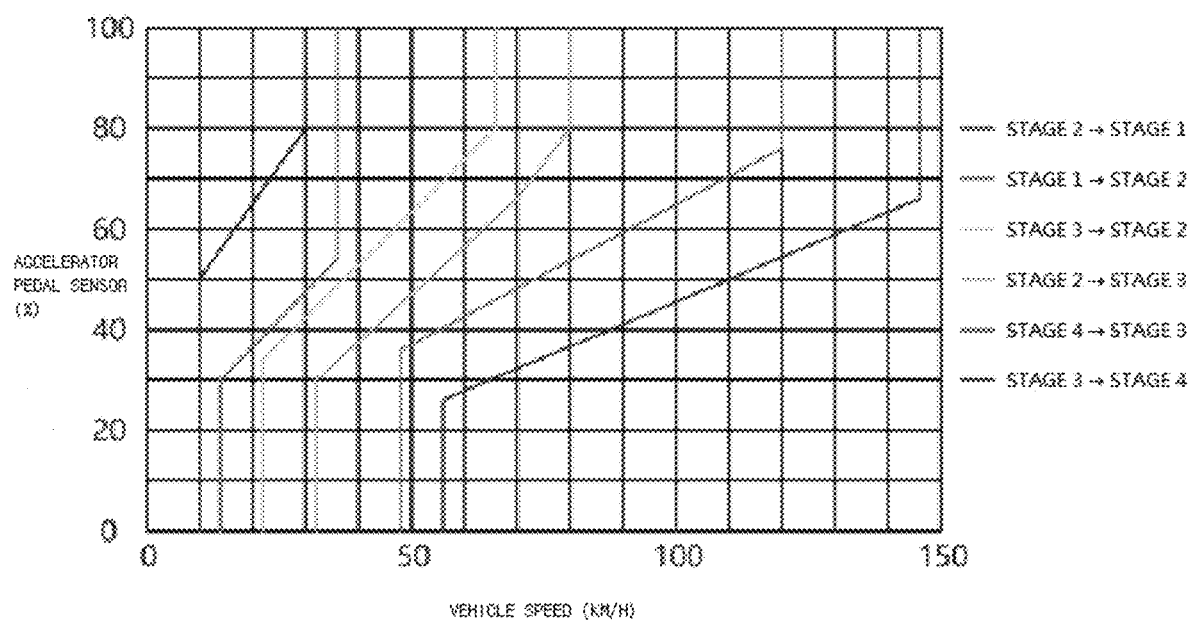
FIG. 5 is a diagram illustrating an example of the gear shift pattern.

FIG. 4 is a diagram illustrating a process in which the control unit calculates a virtual gear stage according to an embodiment of the present invention, and FIG. 5 is a diagram illustrating an example of the gear shift pattern.

Referring to FIG. 4, the process of calculating a virtual gear stage in the above-described step S100 will be described in more detail. First, the control unit 100 continues to receive a current vehicle speed and current APS information of the vehicle from the vehicle speed sensor 500 and the accelerator pedal sensor 510 (S200), and calculates a first APS threshold value corresponding to the current virtual gear stage and the current vehicle speed by interpolating an up shift table for the gear shift pattern based on the vehicle speed and the APS information (S210).

Here, as illustrated in FIG. 5, the up shift table shows lines indicating threshold values for increasing the virtual gear stage from stage 1 to stage 2, from stage 2 to stage 3, and from stage 3 to stage 4. At a time point of an immediate previous virtual gear stage and vehicle speed of the vehicle, a threshold value for increasing the virtual gear stage, that is, a first threshold value, may be calculated from the up shift table.

Once the control unit 100 calculates the first threshold value, at a moment when continuously received current APS information becomes smaller than the first APS threshold value, the virtual gear stage is increased by 1 as compared with the immediately previous virtual gear stage.

In this manner, the control unit 100 calculates a first threshold value, compares the current APS information with the first APS threshold value, and determines whether the current APS information is smaller than the first APS threshold value (S220).

When it is determined the current APS information is smaller than the first APS threshold value, the virtual gear stage is increased by 1 (S230). When it is determined the current APS information is greater than or equal to the first APS threshold value, or when the step S230 is performed, the control unit 100 calculates a second APS threshold value corresponding to the current virtual gear stage and the current vehicle speed by interpolating a down shift table for the gear shift pattern (S240).

When the current APS information is greater than the second APS threshold value, the current virtual gear stage is decreased by 1, and the process returns to the step S200 (S250).

While the step S200 to the step S250 are continuously repeated, when a condition for stopping the operation of the control unit 100 occurs, such as when user setting information is input or the operation of the vehicle is stopped, the process of calculating a virtual gear stage may end.

Figure 6:
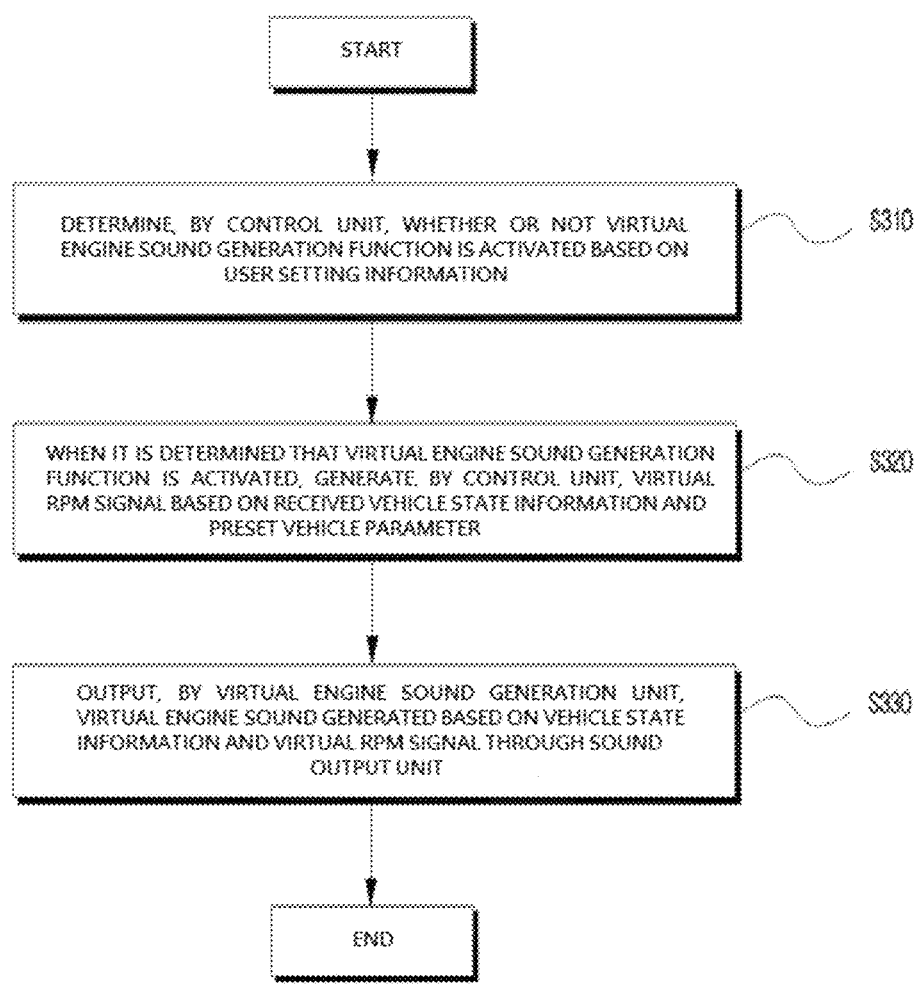
FIG. 6 is a diagram illustrating a process of generating a virtual engine sound according to an embodiment of the present invention.
Figure 7:
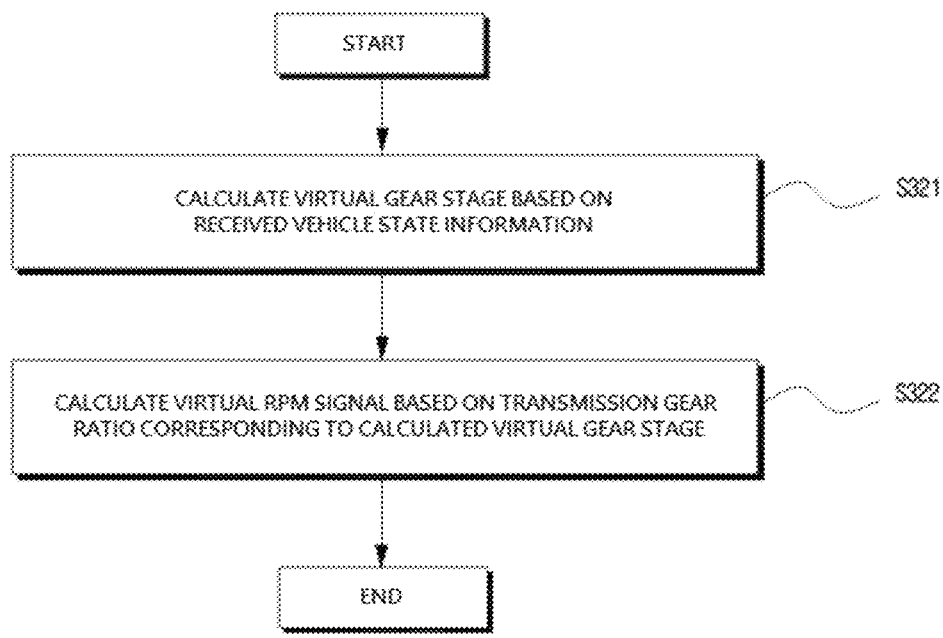
FIG. 7 is a diagram illustrating step S320 of FIG. 6 in more detail.
Figure 8:
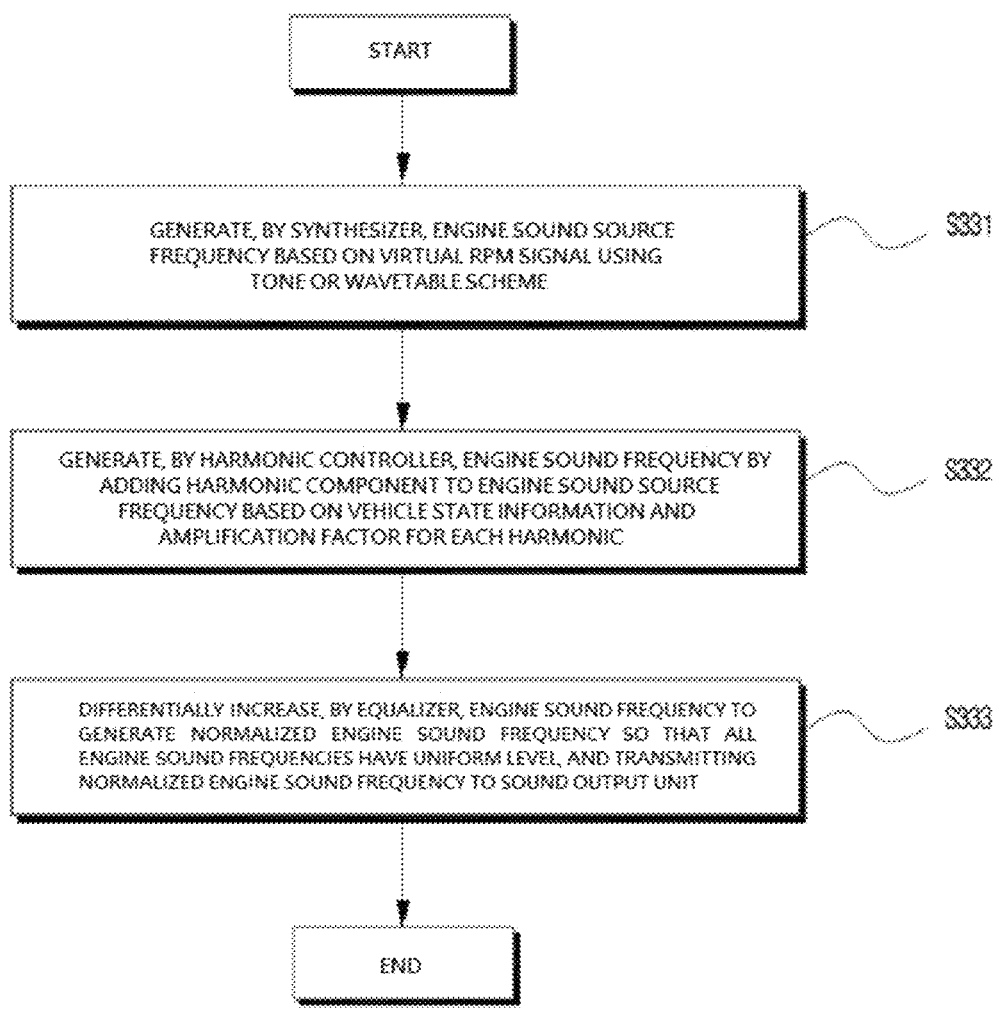
FIG. 8 is a diagram illustrating step S330 of FIG. 6 in more detail.

FIG. 6 is a diagram illustrating a process of generating a virtual engine sound according to an embodiment of the present invention, FIG. 7 is a diagram illustrating step S320 of FIG. 6 as a more specific process, and FIG. 8 is a diagram illustrating step S330 of FIG. 6 as a more specific process.

Referring to FIGS. 6 to 8, a virtual engine sound generation method according to an embodiment of the present invention largely includes: determining, by the control unit 100, whether or not a virtual engine sound generation function is activated based on user setting information (S310); when it is determined that the virtual engine sound generation function is activated, generating, by the control unit 100, a virtual RPM signal based on received vehicle state information and preset vehicle parameters (S320); and generating, by the virtual engine sound generation unit 200, a virtual engine sound based on the vehicle state information and the virtual RPM signal, so that the generated virtual engine sound is output through the sound output unit 300 (S330).

Here, as described above for the virtual engine sound generation system 1000, the vehicle state information is APS information, which is an accelerator pedal pressing rate, and a vehicle speed, and the vehicle parameters are a transmission gear ratio, a final speed reduction ratio, a gear shift pattern, a tire width, a tire flatness ratio, a wheel diameter, the number of stroke cylinders, the number of cylinders, and an amplification factor for each harmonic.

In addition, the step S320, which is a step in which the control unit 100 generates a virtual RPM signal, includes: calculating, by the control unit 100, a virtual gear stage based on the received vehicle state information (S321); and calculating, by the control unit 100, a virtual RPM signal based on a preset transmission gear ratio corresponding to the calculated virtual gear stage (S322).

In order to calculate a virtual gear stage in the step S321, the control unit 100 first receives a current vehicle speed and current APS information of the vehicle, and calculates a first APS threshold value corresponding to the current virtual gear stage and the current vehicle speed by interpolating an up shift table for the gear shift pattern based on the current vehicle speed and the current APS information.

In addition, the control unit 100 determines whether or not the current APS information is smaller than the first APS threshold value. When the current APS information is smaller than the first APS threshold value, the control unit 100 increases the current virtual gear stage by at least 1. When the current APS information is greater than or equal to the first APS threshold value, or when the current virtual gear stage is increased by at least 1, the control unit 100 calculates a second APS threshold value corresponding to the current virtual gear stage and the current vehicle speed by interpolating a down shift table for the gear shift pattern.

When the current APS information is greater than the second APS threshold value, the control unit 100 decreases the current virtual gear stage by at least 1, and returns to the beginning of the process to continue to calculate a virtual gear stage.

Meanwhile, the step S330 includes: generating, by the synthesizer 210, an engine sound source frequency, using a tone or wavetable scheme, based on the virtual RPM signal (S331); generating, by the harmonic controller 220, an engine sound frequency by adding a harmonic component to the engine sound source frequency based on the vehicle state information and a preset amplification factor for each harmonic (S332); and differentially increasing, by the equalizer 230, the engine sound frequency to generate a normalized engine sound frequency so that all engine sound frequencies have a uniform level, and transmitting the normalized engine sound frequency to the sound output unit 300 (S333).

In this case, in the step S331, the synthesizer 210 calculates an engine sound source frequency based on the virtual RPM signal and the vehicle parameters through the following Equation 2.

$$\text{engine sound source frequency} = \frac{\text{virtual } RPM \text{ signal} \times 2}{60 \times S} \times E \quad \text{[Equation 2]}$$

What is claimed is:

1. A virtual engine sound generation system comprising:
   a control unit for generating a virtual RPM signal based on received vehicle state information and a preset vehicle parameter; and
   a virtual engine sound generation unit for generating a virtual engine sound based on the vehicle state information and the virtual RPM signal, to be produced through a sound output unit;
   wherein the control unit calculates a virtual gear stage based on the vehicle state information and a gear shift pattern and generates the virtual RPM signal based on a preset transmission gear ratio corresponding to the calculated virtual gear stage.

2. The virtual engine sound generation system of claim 1, wherein the control unit calculates the virtual RPM signal through the following Equation 1:

$$\text{virtual } RPM \text{ signal} = \frac{\text{vehicle speed (km/h)} \times \text{transmission gear ratio} \times \text{final speed reduction ratio} \times 10^6}{(3.78 \times \text{tire width (mm)} \times \text{flatness ratio}) + (4800 \times \text{wheel diameter(inch)})}. \quad \text{[Equation 1]}$$

3. The virtual engine sound generation system of claim 2, wherein the control unit
   calculates a first APS threshold value and a second APS threshold value based on vehicle speed and APS information, which is an accelerator pedal pressing rate,
   increases the virtual gear stage by at least 1 when the APS information is smaller than the first APS threshold value, and
   decreases the virtual gear stage by at least 1 when the APS information is greater than or equal to the first APS threshold value or when the APS information is greater than the second APS threshold value.

4. The virtual engine sound generation system of claim 3, wherein, based on the vehicle speed and the APS information, the control unit:
  calculates the first APS threshold value corresponding to the virtual gear stage and the vehicle speed by interpolating an up-shift table for the gear shift pattern, and
  calculates the second APS threshold value corresponding to the virtual gear stage and the vehicle speed by interpolating a down-shift table for the gear shift pattern.

5. A virtual engine sound generation method of the virtual engine sound generation system of claim 1, the virtual engine sound generation method further comprising:
  a) determining, by the control unit, whether or not a virtual engine sound generation function is activated based on user setting information;
  b) when it is determined that the virtual engine sound generation function is activated, generating, by the control unit, the virtual RPM signal based on the received vehicle state information and a preset vehicle parameter; and
  c) generating, by the virtual engine sound generation unit, a virtual engine sound based on the vehicle state information and the virtual RPM signal, so that the virtual engine sound is output through the sound output unit.

6. The virtual engine sound generation method of claim 5, wherein the vehicle state information is at least one of APS information, which is an accelerator pedal pressing rate, and a vehicle speed, and
  the vehicle parameter is at least one of a transmission gear ratio, a final speed reduction ratio, a gear shift pattern, a tire width, a tire flatness ratio, a wheel diameter, number of stroke cylinders, number of cylinders, and an amplification factor for each harmonic.

7. The virtual engine sound generation method of claim 6, wherein step b) includes:
  b-1) calculating, by the control unit, a virtual gear stage based on the received vehicle state information; and
  b-2) calculating, by the control unit, the virtual RPM signal based on a preset transmission gear ratio corresponding to the calculated virtual gear stage.

8. The virtual engine sound generation method of claim 7, wherein step b-1) includes:
  b-11) receiving, by the control unit, the vehicle speed and the APS information;
  b-12) calculating, by the control unit, a first APS threshold value corresponding to the virtual gear stage and the vehicle speed by interpolating an up-shift table for the gear shift pattern based on the vehicle speed and the APS information;
  b-13) determining, by the control unit, whether or not the APS information is smaller than the first APS threshold value;
  b-14) increasing, by the control unit, the virtual gear stage by at least 1 when the APS information is smaller than the first APS threshold value;
  b-15) calculating, by the control unit, a second APS threshold value corresponding to the virtual gear stage and the vehicle speed, by interpolating a down shift table for the gear shift pattern, when the APS information is greater than or equal to the first APS threshold value or when step b-14) is performed; and
  b-16) decreasing, by the control unit, the virtual gear stage by at least 1 when the APS information is greater than the second APS threshold value, and returning to step b-11).

9. The virtual engine sound generation method of claim 6, wherein the virtual engine sound generation unit includes:
  a synthesizer for generating an engine sound source frequency, using a tone or wavetable scheme, based on the virtual RPM signal;
  a harmonic controller for generating an engine sound frequency by adding a harmonic component to the engine sound source frequency based on the vehicle state information and a preset amplification factor for each harmonic; and
  an equalizer for differentially increasing the engine sound frequency to generate a normalized engine sound frequency so that all engine sound frequencies have a uniform level,
and transmitting the normalized engine sound frequency to the sound output unit.

10. The virtual engine sound generation method of claim 9, wherein step c) includes:
  c-1) generating, by the synthesizer, an engine sound source frequency, using a tone or wavetable scheme, based on the virtual RPM signal;
  c-2) generating, by the harmonic controller, an engine sound frequency by adding a harmonic component to the engine sound source frequency based on the vehicle state information and a preset amplification factor for each harmonic; and
  c-3) differentially increasing, by the equalizer, the engine sound frequency to generate a normalized engine sound frequency so that all engine sound frequencies have a uniform level,
and transmitting the normalized engine sound frequency to the sound output unit.

11. The virtual engine sound generation method of claim 10, wherein, in step c-1), the synthesizer calculates the engine sound source frequency based on the virtual RPM signal and the vehicle parameter through the following Equation 2:

$$\text{engine sound source frequency} = \frac{\text{virtual RPM signal} \times 2}{60 \times S} \times E, \quad \text{[Equation 2]}$$

where S is the number of stroke cylinders, and E is the number of cylinders.

12. A virtual engine sound generation system comprising:
  a control unit for generating a virtual RPM signal based on received vehicle state information and a preset vehicle parameter; and
  a virtual engine sound generation unit for generating a virtual engine sound, including a sensation of gear shifting, based on the vehicle state information and the virtual RPM signal, to be produced through a sound output unit;
  wherein the virtual engine sound generation unit includes:
  a synthesizer for generating an engine sound source frequency, using a tone or wavetable scheme, and based on the virtual RPM signal;
  a harmonic controller for generating an engine sound frequency by adding a harmonic component to the engine sound source frequency based on the vehicle state information and a preset amplification factor for each harmonic; and
  an equalizer for differentially increasing the engine sound frequency to generate a normalized engine sound frequency so that all engine sound frequencies have a uniform level, and transmitting the normalized engine sound frequency to the sound output unit.

13. The virtual engine sound generation system of claim 12, wherein the synthesizer calculates the engine sound source frequency based on the virtual RPM signal and the vehicle parameter through the following Equation 2:

$$\text{engine sound source frequency} = \frac{\text{virtual RPM signal} \times 2}{60 \times S} \times E, \quad \text{[Equation 2]}$$

where S is a number of stroke cylinders, and E is a number of cylinders.

* * * * *